(12) United States Patent
Rigoni et al.

(10) Patent No.: US 11,703,314 B2
(45) Date of Patent: Jul. 18, 2023

(54) ANALOG ANGLE SENSOR WITH DIGITAL FEEDBACK LOOP

(71) Applicant: Allegro MicroSystems, LLC, Manchester, NH (US)

(72) Inventors: Nicolas Rigoni, Buenos Aires (AR); Octavio H. Alpago, Buenos Aires (AR); Leandro Tozzi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 258 days.

(21) Appl. No.: 16/887,898

(22) Filed: May 29, 2020

(65) Prior Publication Data

US 2021/0372766 A1 Dec. 2, 2021

(51) Int. Cl.
*G01B 7/30* (2006.01)
*G01R 33/00* (2006.01)

(52) U.S. Cl.
CPC ........... *G01B 7/30* (2013.01); *G01R 33/0094* (2013.01)

(58) Field of Classification Search
CPC ....... G01B 7/30; G01R 33/0094; G01P 13/02; G01D 5/2448
See application file for complete search history.

(56) References Cited

U.S. PATENT DOCUMENTS

| | | | |
|---|---|---|---|
| 4,933,640 A | 6/1990 | Kuckes | |
| 9,389,060 B2 | 7/2016 | Romero et al. | |
| 9,400,164 B2 | 7/2016 | Daubert et al. | |
| 9,417,295 B2 | 8/2016 | Friedrich et al. | |
| 9,574,867 B2 | 2/2017 | Uberti et al. | |
| 9,739,847 B1 | 8/2017 | Alpago et al. | |
| 10,884,092 B2 | 1/2021 | Rigoni et al. | |
| 11,175,160 B2 | 11/2021 | Aguirre et al. | |

(Continued)

FOREIGN PATENT DOCUMENTS

| IE | 2009/0465 27 | 12/2009 |
|---|---|---|
| JP | 2016-61708 A | 4/2016 |
| WO | WO 2015/156635 A1 | 10/2015 |

OTHER PUBLICATIONS

Infineon, TLE5xxx(D) Calibration 360, Mar. 2018, p. 2, 7, 8 (Year: 2018).*

(Continued)

*Primary Examiner* — Tarun Sinha
(74) *Attorney, Agent, or Firm* — Daly, Crowley, Mofford & Durkee, LLP

(57) ABSTRACT

An angle sensor comprising: a plurality of magnetic field sensing elements configured to detect a magnetic field and generate a respective plurality of analog magnetic field signals; a plurality of analog frontend circuits each analog frontend circuit associated with a respective magnetic field sensing element; and a digital feedback circuit configured to generate digital magnetic field signals from the plurality of analog magnetic field signals and generate digital error correction values, wherein the plurality of analog frontend circuits are configured to obtain the digital error correction values from the digital feedback circuit, generate analog correction values from the digital error correction values, and apply the analog correction values to the plurality of analog magnetic field signals to generate a plurality of corrected analog magnetic field signals.

9 Claims, 4 Drawing Sheets

(56) References Cited

U.S. PATENT DOCUMENTS

| | | | |
|---|---|---|---|
| 11,333,486 | B2 | 5/2022 | Rigoni et al. |
| 2002/0180428 | A1 | 12/2002 | Weser |
| 2005/0283988 | A1 | 12/2005 | Sato et al. |
| 2006/0089784 | A1 | 4/2006 | Spicer et al. |
| 2006/0290545 | A1 | 12/2006 | Granig et al. |
| 2009/0174395 | A1 | 7/2009 | Thomas et al. |
| 2009/0212771 | A1 | 8/2009 | Cummings et al. |
| 2011/0267041 | A1 | 11/2011 | Li et al. |
| 2013/0265037 | A1 | 10/2013 | Friedrich et al. |
| 2013/0314075 | A1 | 11/2013 | Ausserlechner et al. |
| 2015/0022186 | A1 | 1/2015 | Ausserlechner |
| 2017/0356966 | A1 | 12/2017 | Romero |
| 2017/0356967 | A1 | 12/2017 | Romero |
| 2018/0017418 | A1 | 1/2018 | Deak |
| 2020/0116470 | A1* | 4/2020 | Yamamoto ............... G01D 5/14 |

OTHER PUBLICATIONS

European Examination Report dated Nov. 15, 2021 for European Application No. 17730321.1; 11 pages.

Response to Examination Report filed on May 24, 2022 for European Application No. 17730321.1, 25 pages.

Notice of Allowance dated Feb. 25, 2019 for U.S. Appl. No. 15/180,199; 10 pages.

PCT International Preliminary Report on Patentability dated Dec. 27, 2018; for International Application No. PCT/US2017/035702; 10 pages.

PCT International Search Report and Written Opinion dated Aug. 28, 2017 for International Application No. PCT/US2017/035702; 15 pages.

U.S. Non-Final Office Action dated Jul. 27, 2018 for U.S. Appl. No. 15/180,199; 13 pages.

Response to U.S. Non-Final Office Action dated Jul. 27, 2018 for U.S. Appl. No. 15/180,199; Response filed Oct. 24, 2018; 15 pages.

EP Communication pursuant to Rules 161 (1) and 162EPC—Correction of deficiencies dated Jan. 25, 2019 for EP Pat. Appl. No. 17730321.1-1022; 3 pages.

Response Filed on Jul. 31, 2019 for European Application No. 17730321.1; 23 Pages.

Notice of Allowance dated Oct. 27, 2020 for U.S. Appl. No. 16/214,768; 12 pages.

\* cited by examiner

ANALOG ANGLE SENSOR WITH DIGITAL FEEDBACK LOOP

BACKGROUND

Various types of magnetic field sensing elements are known, including Hall Effect elements and magnetoresistance (MR) elements. Magnetic field sensors generally include a magnetic field sensing element and other electronic components. Magnetic field sensors provide an electrical signal representative of a sensed magnetic field. In some sensors that have a back-bias magnet, the sensed magnetic field is a magnetic field generated by the magnet, in which case, in the presence of a moving ferromagnetic object, the magnetic field generated by the magnet and sensed by the magnetic field sensor varies in accordance with aspects of the moving ferromagnetic object, such as shape, profile, speed, direction and angle In contrast, magnetic field sensors that sense a moving magnet directly sense variations of magnetic field that result from movement of the magnet.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to aspects of the disclosure, an angle sensor is provided including: a plurality of magnetic field sensing elements configured to detect a magnetic field and generate a respective plurality of analog magnetic field signals, a plurality of analog frontend circuits each analog frontend circuit associated with a respective magnetic field sensing element, and a digital feedback circuit configured to generate digital magnetic field signals from the plurality of analog magnetic field signals and generate digital error correction values, wherein the plurality of analog frontend circuits are configured to obtain the digital error correction values from the digital feedback circuit, generate analog correction values from the digital error correction values, and apply the analog correction values to the plurality of analog magnetic field signals to generate a plurality of corrected analog magnetic field signals.

According to aspects of the disclosure, a sensor is provided, including: a feedback circuit that is configured to generate a first feedback signal, a first magnetic field sensing element that is arranged to generate a first sensor signal, the first sensor signal being a cosine projection of a rotational angle of a target, a second magnetic field sensing element that is arranged to generate a second sensor signal, the second sensor signal being a sinusoidal projection of the rotational angle of the target, a first analog frontend circuit that is arranged to receive the first sensor signal from the first magnetic field sensing element, receive the first feedback signal from the feedback circuit, and provide, to the feedback circuit, a first corrected sensor signal, the first corrected sensor signal being generated by adjusting a gain of the first sensor signal based on the first feedback signal, and a second analog frontend circuit that is arranged to receive the second sensor signal from the second magnetic field sensing element, receive the first feedback signal from the feedback circuit, and provide, to the feedback circuit, a second corrected sensor signal, the second corrected sensor signal being generated by adjusting a gain of the second sensor signal based on the first feedback signal, wherein the first feedback signal is generated at least in part based on a first amplitude of the first corrected sensor signal and a second amplitude of the second corrected sensor signal.

According to aspects of the disclosure, a sensor is provided including: a feedback circuit that is configured to generate a first feedback signal and a second feedback signal, a first magnetic field sensing element that is arranged to generate a first sensor signal, the first sensor signal being a cosine projection of a rotational angle of a target, a second magnetic field sensing element that is arranged to generate a second sensor signal, the second sensor signal being a sinusoidal projection of the rotational angle of the target, a first analog frontend circuit that is arranged to receive the first sensor signal from the first magnetic field sensing element, receive the first feedback signal from the feedback circuit, and provide, to the feedback circuit, a first corrected sensor signal, the first corrected sensor signal being generated by adjusting adjust a gain of the first sensor signal based on the first feedback signal, and a second analog frontend circuit that is arranged to receive the second sensor signal from the second magnetic field sensing element, receive the first feedback signal from the feedback circuit, and provide, to the feedback circuit, a second corrected sensor signal, the second corrected sensor signal being generated by adjusting a gain of the second sensor signal based on the first feedback signal, wherein the first feedback signal is generated based on an offset of the first corrected sensor signal, and the second feedback signal is generated based on an offset of the second corrected sensor signal.

BRIEF DESCRIPTION OF THE DRAWING FIGURES

Other aspects, features, and advantages of the claimed invention will become more fully apparent from the following detailed description, the appended claims, and the accompanying drawings in which like reference numerals identify similar or identical elements. Reference numerals that are introduced in the specification in association with a drawing figure may be repeated in one or more subsequent figures without additional description in the specification in order to provide context for other features.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, and a magnetic field sensor that senses a magnetic field density of a magnetic field.

By way of example, the terms "target" and "magnetic target" are used to describe an object to be sensed or detected by a magnetic field sensor or magnetic field sensing element. The object may be a magnet or other magnetic or ferromagnetic object.

Figure 1A:
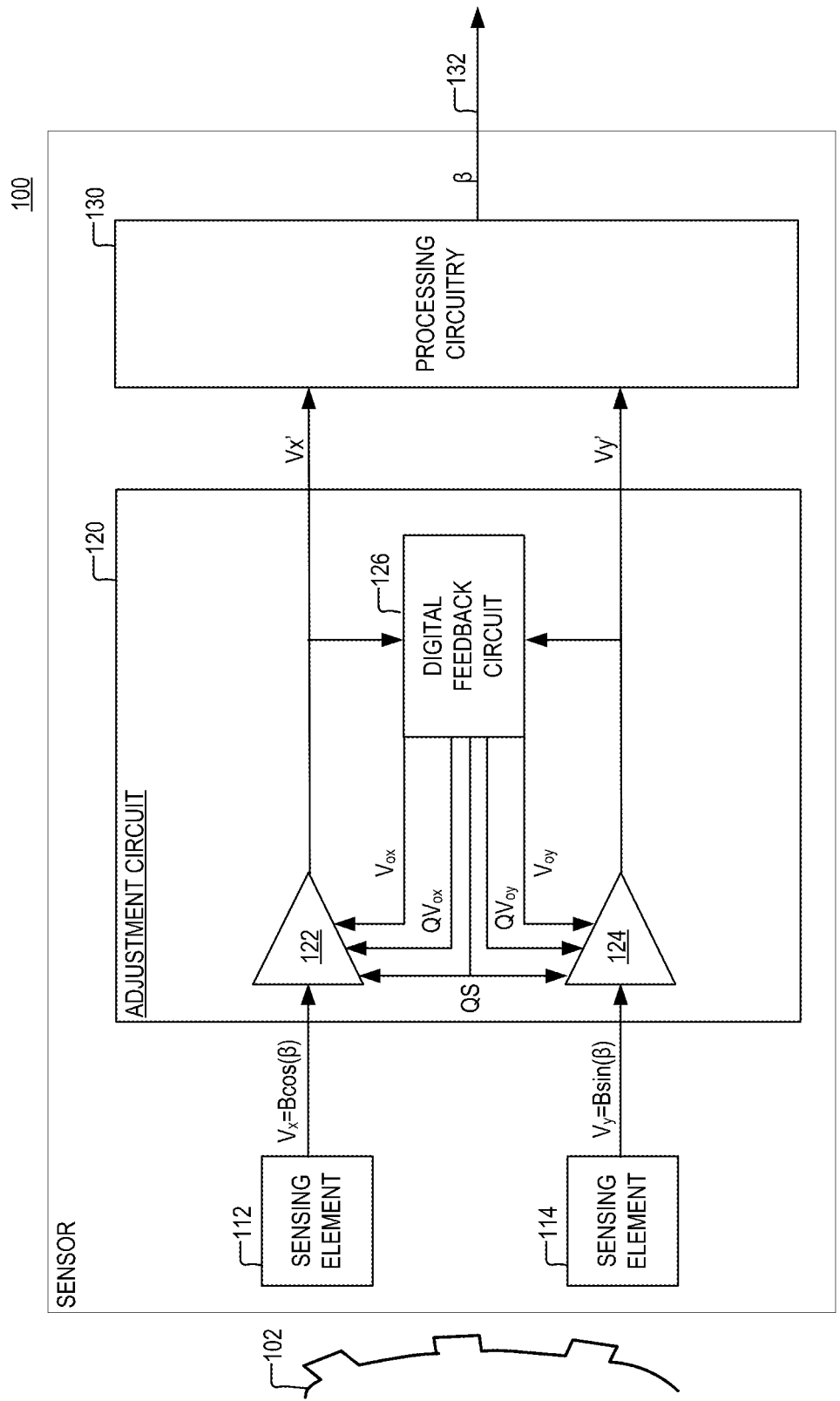
FIG. 1A is a diagram of an example of a magnetic field sensor, according to aspects of the disclosure.

FIG. 1A is a block diagram of a sensor 100, according to aspects of the disclosure. In operation, the sensor 100 may be configured to detect a magnetic field associated with a rotating target 102 and output a signal 132 that identifies the rotational angle β of the target 102. The sensor 100 may include a magnetic field sensing element 112, a magnetic field sensing element 114, a adjustment circuit 120, and a processing circuitry 130. The magnetic field sensing element 112 may be configured to generate a sensor signal $V_x$, which is a cosine projection of the rotational angle β of the target 102, and supply the sensor signal $V_x$ to the adjustment circuit 120. The sensing element 114 may be configured to generate a sensor signal $V_y$, which is a sinusoid projection of the rotational angle β of the target 102, and supply the sensor signal $V_y$ to the adjustment circuit 120. The adjustment circuit 120 may adjust the gain and/or offset of the sensor signal $V_x$ to produce a signal $V_x'$. The adjustment circuit 120 may also adjust the gain and/or offset of the sensor signal $V_y$ to produce a signal $V_y'$. The adjustment circuit 120 may provide the signals $V_x'$ and $V_y'$ to the processing circuitry 130, as shown. The processing circuitry 130 may receive the signals $V_x'$ and $V_y'$ from the adjustment circuit 120 and use them as a basis for generating the output signal 132. In some implementations, the processing circuitry 130 can generate the output signal 132 in accordance with Equation 1 below:

$$\beta = \arctan\left(\frac{Vy'}{Vx'}\right) \quad (1)$$

Figure 1B:
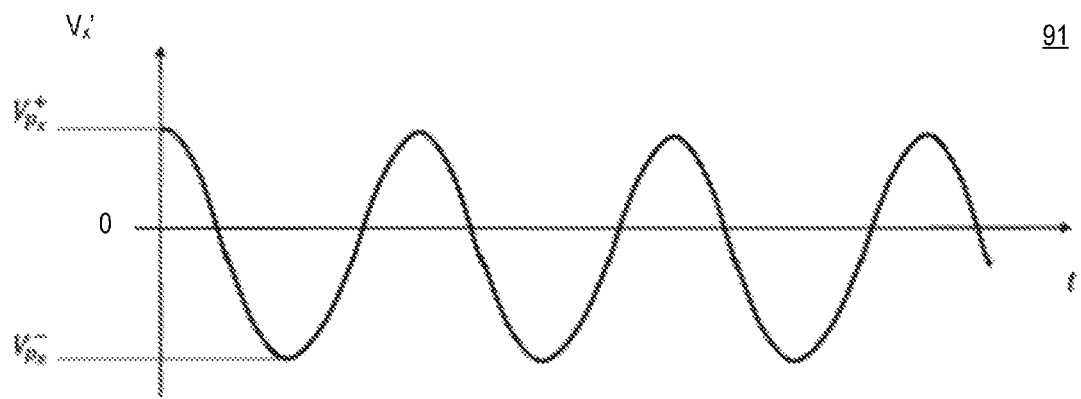
FIG. 1B is a plot of signals that are output by sensing elements in the magnetic field sensor of FIG. 1A, according to aspects of the disclosure.
Figure 1B:
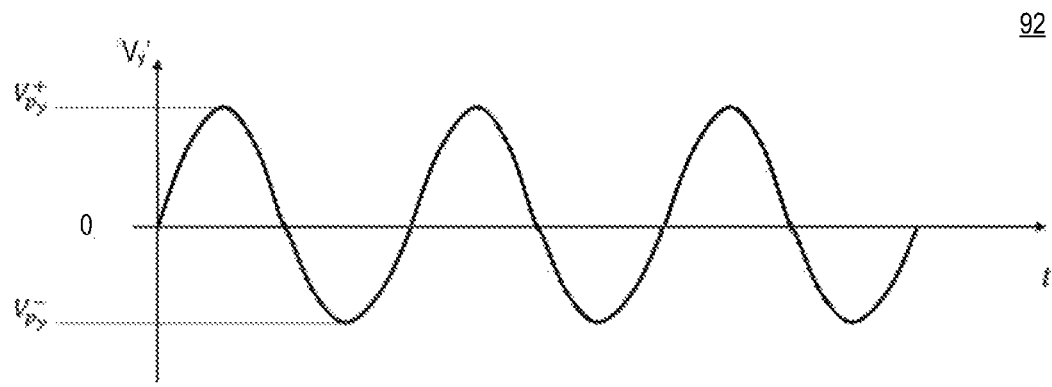

Although in the example of FIG. 1 the adjustment circuit 110 and the processing circuitry 130 are depicted as separate units, it will be understood that in some implementations they may be at least partially integrated with one another. Additionally or alternatively, although in the example of FIG. 1 the processing circuitry 130 is integrated into the sensor 100, alternative implementations are possible in which at least some of the processing circuitry 130 is external to the sensor 100. In such implementations, the processing circuitry may include analog outputs (internal to the sensor 100), that are arranged to provide the signals $V_x'$ and $V_y'$ to an external ECU that implements the arctan calculation.

The adjustment circuit 120 may use feedback to adjust the gain and/or offset of the signals $V_x'$ and $V_y'$. Specifically, the adjustment circuit 120 may adjust the gain and/or offset of the signals $V_x'$ and $V_y'$ based on feedback signals that are generated within the adjustment circuit 120. The feedback signals may be based on the respective offsets and amplitudes of the signals $V_x'$ and $V_y'$. The respective offsets and amplitudes of the signals $V_x'$ and $V_y'$ are illustrated in FIG. 1B. More particularly, FIG. 1B shows a plot 91 of the signal $V_x'$ and a plot 92 of the signal $V_y'$. The signal $V_x'$ may include a cosine waveform having a positive peak $V^+_{px}$ and a negative peak $V^-_{px}$. The signal $V_y'$, may include a sinusoid waveform having a positive peak $V^+_{py}$ and a negative peak $V^-_{py}$. The positive and negative peaks of the signals $V_x'$, and $V_y'$ define respective offsets and amplitudes of the signals $V_x'$ and $V_y'$ as follows:

$$V_{ppx} = V_{px}^+ - V_{px}^- \quad (2)$$

$$V_{ox} = V_{px}^+ + V_{px}^- \quad (3)$$

$$V_{ppy} = V_{py}^+ - V_{py}^- \quad (4)$$

$$V_{oy} = V_{py}^+ + V_{py}^- \quad (5)$$

where $V_{ppx}$ is the peak-to-peak amplitude of the signal $V_x$, $V_{ox}$ is the offset of the signal $V_x$, $V_{ppy}$ is the amplitude of the signal $V_y$, and $V_{oy}$ is the offset of the signal $V_y$.

Returning to FIG. 1A, the adjustment circuit 120 may include a first analog frontend circuit 122, a second analog frontend circuit 124, and a digital feedback circuit 126. The first analog frontend circuit 122 may be arranged to adjust the gain and/or offset of the sensor signal $V_x$ to produce the signal $V_x'$. More particularly, the first analog frontend circuit 122 may be configured to receive signals QS, $V_{ox}$, and $QV_{ox}$ from the digital feedback circuit 126 and generate the signal $V_x'$ based on those signals. The signal QS may be generated (by the digital feedback circuit 126) based on a difference between the amplitudes $V_{ppx}$ and $V_{ppy}$ of the signals $V_x'$ and $V_y'$, respectively and may be referred to as a sensitivity error correction value. The signal $QV_{ox}$ may be generated by averaging the offset $V_{ox}$ of the signal $V_x'$ over a predetermined number of samples and may be referred to as an offset error correction value. And the signal $V_{ox}$, as noted above in Equation 3, may be generated based on the difference between a positive and a negative peak of the signal $V_x'$ that are part of the same cycle.

The second analog frontend circuit 124 may be arranged to adjust the gain and/or offset of the sensor signal $V_y$ to produce the signal $V_y'$. The second analog frontend circuit 124 may be configured to receive signals QS, $V_{oy}$, and $QV_{oy}$ from the digital feedback circuit 126 and generate the signal $V_y'$ based on those signals. The signal QS may be generated (by the digital feedback circuit 126) based on a difference between the amplitudes $V_{ppx}$ and $V_{ppy}$ of the signals $V_x'$ and $V_y'$, respectively. The signal $QV_{oy}$ may be generated by averaging the offset $V_{oy}$ of the signal $V_y'$ over a predetermined number of samples and may be referred to as a sensitivity error correction value. And the signal $V_{oy}$, as noted above in Equation 5, may be generated based on the difference between a positive and a negative peak of the signal $V_y'$ that are part of the same cycle.

The operations performed by the adjustment circuit 120 to generate the signals Vx' and Vy' may be described by Equations 6-12 below:

$$V_x' = B(V_x)(S_o - QS)G_0\left(1 + \frac{\Delta}{2}\right) + V_{ox} - QV_{ox} \quad (6)$$

$$QS = \frac{\int_1^k \left(\frac{V_{ppx}}{V_{ppy}} - 1\right)}{k} \quad (7)$$

$$QV_{ox} = \frac{\int_1^n V_{ox}}{n} \quad (8)$$

$$V_x = \cos(\beta) \quad (9)$$

$$V_y' = B(V_{ry})(S_o + QS)G_0\left(1 - \frac{\Delta}{2}\right) + V_{oy} - QV_{oy} \quad (10)$$

$$QV_{oy} = QV_{ox} = \frac{\int_1^m V_{oy}}{m} \quad (11)$$

$$V_y = \sin(\beta) \quad (12)$$

where B is the magnetic field density of the magnetic field that is sensed by the sensor based on the target 102, is the rotational angle of the target 102, $V_x$ is the raw sensor signal that is generated by the sensing element 112, $V_y$ is the raw sensor signal that is generated by the sensing element 114, n is a positive integer greater than one, m is a positive integer greater than one, k is a positive integer greater than one, $S_0$ is a nominal transducer sensitivity of the magnetic field sensing elements 112 and 114, Go is a nominal analog frontend gain of the adjustment circuit 120, $\Delta$ is a gain/sensitivity mismatch between the sensing elements 112 and 114, $V_{ppx}$ is the peak-to-peak amplitude of the signal $V_x'$, and $V_{ppy}$ is the peak-to-peak amplitude of the signal $V_y'$, $V_{ox}$ is the offset of the signal $V_x'$, $V_{oy}$ is the offset of the signal $V_y'$. In some implementations, the signal $S_o$ may be generated at least in part based on one or more signals that are provided by a temperature sensor (not shown) that is integrated into the sensor 100. In this regard, the signal $S_o$ may be used to compensate for any changes in the sensitivity of the sensing elements 112 and 114 that result from changes in the temperature of the sensor 100.

Figure 2:
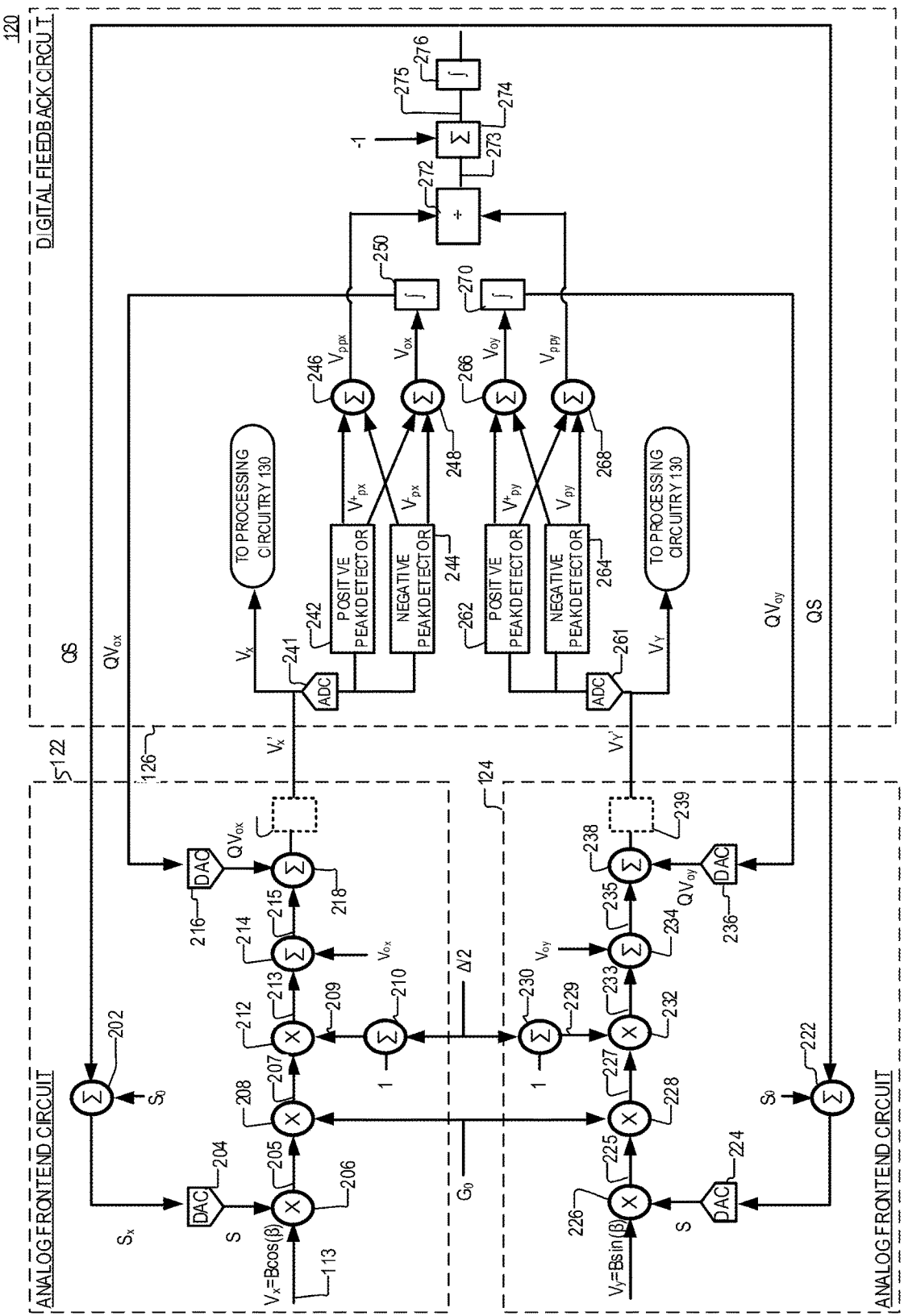
FIG. 2 is a diagram of an adjustment circuit that is part of the sensor of FIG. 1A, according to aspects of the disclosure.

FIG. 2 shows an example of one possible implementation of the adjustment circuit 120, according to aspects of the disclosure.

According to the example of FIG. 2, the first analog frontend circuit 122 may include a summation element 202, a digital-to-analog converter (DAC) 204, multiplication element 206, a multiplication element 208, a summation element 210, a multiplication element 212, a summation element 214, a DAC 216, and a summation element 218. In operation, the summation element 202 may subtract the signal QS from the signal $S_0$ to produce a signal $S_x$, which is converted to analog form by DAC 204, and provided to the multiplication element 206. As noted above, adjusting the gain of the signal $V_x$ based on the signal $S_o$ may compensate for any changes in the sensitivity of the sensing element 112 that are caused by variations in temperature. On the other hand, adjusting the gain of the signal $V_x$ based on the signal QS may compensate for any mismatch between the respective sensitivities of the magnetic field sensing element 112 and the sensing element 114, which can result from manufacturing tolerances and aging for example.

The multiplication element 206 may multiply the signal $V_x$ by the signal S to produce a signal 205. The multiplication element 208 may multiply the signal 205 by a signal Go to produce a signal 207. As noted above, the value of the signal Go may represent the nominal frontend gain of the adjustment circuit 120. The summation element 210 may add '1' to a signal $\Delta/2$ to produce a signal 209. As noted above, the value of A may represent a gain/sensitivity mismatch between the sensing elements 112 and 114. The multiplication element 212 may multiply the signal 209 by the signal 207 to produce a signal 213. The summation element 214 may add the signal 213 to the signal $V_{ox}$ to produce a signal 215. The DAC 216 may convert to analog form a signal $QV_{ox}$ and provide it to the summation element 218. The summation element 218 may subtract the signal $QV_{ox}$ from the signal 215 to produce the signal $V_x'$. As noted above, signal $V_{ox}$ may be a feedback signal whose value represents the offset of the signal $V_x'$, and the signal $QV_{ox}$ may represent the average of n most recent samples of the signal $V_{ox}$. In other words, summation element 214 and summation elements 218 may effectively adjust the gain of the signal $V_x$ based on a difference between a most recent sample of the signal $V_{ox}$ and an average value of the signal $V_{ox}$ (which is calculated over a set of previous samples).

According to the example of FIG. 2, the second analog frontend circuit 124 may include a summation element 222, a digital-to-analog converter (DAC) 224, multiplication element 226, a multiplication element 228, a summation element 230, a multiplication element 232, a summation element 234, a DAC 236, and a summation element 238. In operation, the summation element 222 may subtract the signal QS from the signal $S_0$ to produce a signal S, which is converted to analog form by DAC 224, and provided to the multiplication element 226. As noted above, adjusting the gain of the signal $V_y$, based on the signal $S_o$, may be generated, at least in part based on a signal from a temperature sensor, and it may compensate for any changes in the sensitivity of the sensing element 114 that are caused by variations in temperature. On the other hand, adjusting the gain of the signal $V_y$ based on the signal QS may compensate for any mismatch between the respective sensitivities of sensing element 112 and the sensing element 114, which result from manufacturing tolerances and aging for example.

The multiplication element 226 may multiply the signal $V_y$ by the signal S to produce a signal 225. The multiplication element 228 may multiply the signal 225 by a signal Go to produce a signal 227. As noted above, the value of the signal Go may represent the nominal frontend-gain of the adjustment circuit 120. The summation element 230 may subtract the signal $\Delta/2$ from the value of '1' to produce a signal 229. As noted above, the value of A may represent a gain/sensitivity mismatch between the sensing elements 112 and 114. The multiplication element 232 may multiply the signal 229 by the signal 227 to produce a signal 233. The summation element 234 may add the signal 233 to the signal $V_{oy}$ to produce a signal 235. The DAC 236 may digitize a signal $QV_{oy}$ and provide it to the summation element 238. The summation element 238 may subtract the signal $QV_{oy}$ from the signal 235 to produce the signal $V_y'$. As noted above, signal $V_{oy}$ may be a feedback signal whose value represents the offset of the signal $V_y'$, and the signal $QV_{oy}$ may represent the average of m most recent samples of the signal $V_{oy}$. In other words, summation element 234 and summation elements 238 may effectively adjust the gain of the signal $V_y$ based on a difference between a most recent sample of the signal $V_{oy}$ and an average value of the signal $V_{oy}$ (which is calculated over a set of previous samples).

The digital feedback circuit 126 may include an analog-to-digital converter (ADC) 241, a positive peak detector 242, a negative peak detector 244, a summation element 246, a summation element 248, and an integrator 250. In operation, the ADC 241 may digitize the signal $V_x'$ and provide it to the positive peak detector 242 and the negative peak detector 244. The positive peak detector 242 may generate a positive peak signal $V^+_{px}$ based on the signal $V_x'$ and provide it to the summation elements 246 and 248. The negative peak detector 244 may generate a negative peak signal $V^-_{px}$ based on the signal $V_x'$ and provide it to the summation elements 246 and 248. The summation element 246 may subtract the signal $V^-_{px}$ from the signal $V^+_{px}$ to produce a signal $V_{ppx}$. The summation element 248 may add the signals $V^-_{px}$ and $V^+_{px}$ to produce a signal $V_{ox}$. The integrator 250 may average a set of n most recent samples of the signal $V_{ox}$ to produce the signal $QV_{ox}$.

The digital feedback circuit 126 may further include an analog-to-digital converter (ADC) 261, a positive peak detector 262, a negative peak detector 264, a summation element 266, a summation element 268, and an integrator 270. In operation, the ADC 261 may digitize the signal $V_y'$ and provide it to the positive peak detector 262 and the negative peak detector 264. The positive peak detector 262 may generate a positive peak signal $V^+_{py}$ based on the signal $V_y'$ and provide it to the summation elements 266 and 268. The negative peak detector 264 may generate a negative peak signal $V^-_{py}$ based on the signal $V_y'$ and provide it to the summation elements 266 and 268. The summation element 268 may add the signals $V^-_{py}$ and $V^+_{py}$ to produce a signal $V_{ppy}$. The summation element 266 may add the signals $V^-_{py}$ and $V^+_{py}$ to produce the signal $V_{oy}$. The integrator 250 may average a set of m most recent samples of the signal $V_{ox}$ to produce the signal $QV_{ox}$.

The digital feedback circuit 126 may further include a divider 272, a summation element 274, and an integrator 276. The divider 272 may divide the signal $V_{ppx}$ over the signal $V_{ppy}$ to produce a signal 273. The summation element 274 may subtract '1' from the signal 273 to produce a signal 275. And the integrator 276 may average a set of samples of the 275 to produce the signal QS.

According to the present example, the signal $V^+_{px}$ may identify a most recent positive peak of the signal $V_x'$; the signal $V^-_{px}$ may identify a most recent negative peak of the signal $V_x'$; the signal $V^+_{py}$ may identify a most recent positive peak of the signal $V_y'$; and the signal $V^-_{py}$ may identify a most recent negative peak of the signal $V_y'$. The signal $V_{ppx}$ may identify the amplitude of the signal $V_x'$, and it may be calculated in accordance with Equation 2, which is discussed above with respect to FIG. 1B. The signal $V_{ppy}$ may identify the amplitude of the signal $V_y'$, and it may be calculated in accordance with Equation 4, which is discussed above with respect to FIG. 1B. The signal $V_{ox}$ may identify the offset of the signal $V_x'$, and it may be calculated in accordance with Equation 3, which is discussed above with respect to FIG. 1B. The signal $V_{oy}$ identify the offset of the signal $V_y'$, and it may be calculated in accordance with Equation 5, which is discussed above with respect to FIG. 1B. The signal $QV_{ox}$ may identify the average of n most recent samples of the signal $V_{ox}$, and it may be calculated in accordance with Equation 8, which is discussed above with respect to FIGS. 1A-B. The signal $QV_{oy}$ may identify the average of m most recent samples of the signal $V_{oy}$, and it may be calculated in accordance with Equation 11, which is discussed above with respect to FIGS. 1A-B.

The signal QS may be calculated in accordance with Equation 7, which is discussed above with respect to FIGS. 1A-B. The signal QS may indicate the average of k samples of the signal 275. The signal 275 may indicate the difference between the value '1' and the ratio of the signals $V_{ppx}$ and $V_{ppy}$, which identify the respective amplitudes of the signals $V_x'$ and $V_y'$, respectively. As can be readily appreciated, the signal 275 may have the value of '0' when the signals $V_x'$ and $V_y'$ have the same amplitude, and it may have a value different than '0' when the signals $V_x'$ and $V_y'$ have different amplitudes. In other words, the signal QS may indicate a difference between the respective amplitudes of the signals $V_x'$ and $V_y'$.

Although in the example of FIG. 2 the peak detectors 242, 244, 262, and 266 are implemented in the digital domain, alternative implementations are possible in which any of the peak detectors 242, 244, and 262, and 266 are implemented in the analog domain (as illustrated by optional alternative peak detectors 219, and 239). In such implementations, instead of digitizing the full spectrum of the signals $V_x'$ and $V_y'$ (by using ADC 241 and ADC 261, respectively), the adjustment circuit 120 may digitize only the peak values $V^-_{px}$, $V^+_{px}$, $V^-_{py}$ and $V^+_{py}$, of the signals $V_x'$ and $V_y'$. The peak values of the signals $V_x'$ and $V_y'$ may be DC signals, and they can be digitized with a high oversampling ratio, which in turn allows a simpler ADC design to be used. Although in the example of FIG. 2, the integrator 276 is implemented in the digital domain, alternative implementations are possible in which the integrator 276 is implemented, in the analog domain, as a low-pass filter.

Figure 3:
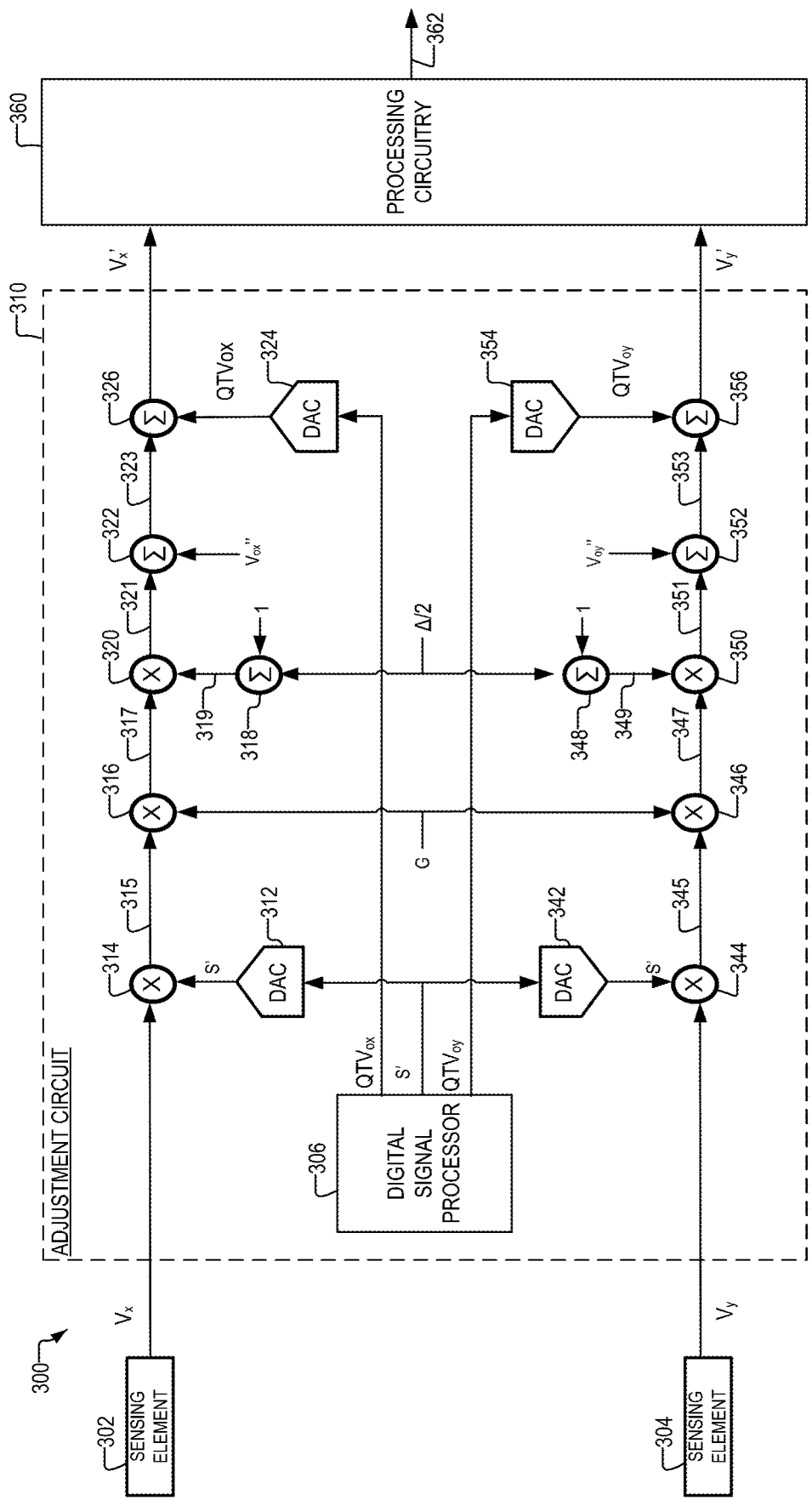
FIG. 3 is a diagram of a magnetic field sensor, according to the prior art.

FIG. 3 is a diagram of an example of a sensor 300, according to the prior art. In operation, the sensor 300 may be configured to detect a magnetic field of a rotating target (not shown) and output a signal 362 that identifies the rotational angle β of the target. The sensor 300 may include a magnetic field sensing element 302, a magnetic field sensing element 304, a adjustment circuit 310, and a processing circuitry 360. The magnetic field sensing element 302 may be configured to output a sensor signal $V_x$, which is a cosine projection of the rotational angle β, and supply the sensor signal $V_x$ to the adjustment circuit 120. The magnetic field sensing element 304 may be configured to output a sensor signal $V_y$, which is a sinusoid projection of the rotational angle β and supply the sensor signal $V_y$ to the adjustment circuit 310. The adjustment circuit 310 may adjust the gain of the sensor signal $V_x$ to produce a signal $V_x'$. The adjustment circuit 310 may also adjust the gain of the sensor signal $V_y$ to produce a signal $V_y'$. The adjustment circuit 310 may provide the signal $V_x'$ and $V_y'$ to the processing circuitry 310, as shown. And the processing circuitry 360 may use the signals $V_x'$ and $V_y'$ to generate the output signal 362.

The adjustment circuit 310 may include a digital signal processor 306 that is configured to generate signals S', $QTV_{ox}$, and $QTV_{oy}$. The signal $QTV_{ox}$ may be generated by the processing circuitry based on a temperature signal that is received at the digital signal processor 306 from an integrated temperature sensor (not shown), and it may represent an offset adjustment over temperature (for the signal $V_x$). The signal $QTV_{oy}$ may be generated by the processing circuitry based on a temperature signal that is received at the digital signal processor 306 from the integrated temperature sensor (not shown), and it may represent an offset adjustment over temperature (for the signal $V_x$). The signal S' may be generated by the processing circuitry based on a temperature signal that is received at the digital signal processor 306 from the integrated temperature sensor (not shown), and it may represent a sensitivity adjustment over temperature.

The adjustment circuit 310 may further include a DAC 312, a multiplication element 314, a multiplication element 316, a summation element 318, a multiplication element 320, a summation element 322, a DAC 324, and a summation element 326. In operation, the DAC 312 may convert the signal S' to analog form and provide it to the multiplication element 314. The multiplication element 314 may multiply the signal S' by the signal $V_x$ to produce a signal 315. The multiplication element 316 may multiply a signal G by the signal 315 to produce a signal 317. The signal G may represent a nominal frontend gain of the adjustment circuit 310. The summation element 318 may add '1' to a signal $\Delta/2$ to produce a signal 319. The value of the signal $\Delta/2$ may represent gain/sensitivity mismatch between the sensing elements 302 and 304. The multiplication element 320 may multiply the signal 319 by the signal 317 to produce a signal 321. The summation element 322 may add the signal 321 to a signal $V_{ox}"$ to produce a signal 323. The DAC 324 may convert to analog form the signal $QTV_{ox}$ and provide it to the summation element 326. The summation element 326 may subtract the signal $QTV_{ox}$ from the signal 323 to produce the signal $V_x'$. In some implementations, the signal $V_{ox}"$ may be a natural offset of any analog circuitry that is interposed between the adjustment circuit 310 and the sensing element 302. Furthermore, unlike the adjustment circuit 120, the adjustment circuit 310 does not adjust the gain of the signal $V_x$ based on a feedback signal, such as the signal QS, which indicates the degree by which the amplitudes of signals $V_x'$ and $V_y'$ (i.e., the signals output from a adjustment circuit) differ from one another.

The adjustment circuit 310 may further include a DAC 342, a multiplication element 344, a multiplication element 346, a summation element 348, a multiplication element 350, a summation element 352, a DAC 354, and a summation element 356. In operation, the DAC 342 may convert the signal S' to analog form and provide it to the multiplication element 344. The multiplication element 344 may multiply the signal S' by the signal $V_y$ to produce a signal 345. The multiplication element 346 may multiply the signal G by the signal 345 to produce a signal 347. As noted above, the signal G may represent a nominal frontend gain of the adjustment circuit 310. The summation element 348 may subtract the signal $\Delta/2$ from the value of '1' to produce a signal 349. As noted above, the signal $\Delta/2$ may represent a gain/sensitivity mismatch between the sensing elements 302 and 304. The multiplication element 350 may multiply the signal 349 by the signal 347 to produce a signal 351. The summation element 352 may add the signal 351 to a signal $V_{oy}"$ to produce a signal 353. The DAC 354 may convert to analog form the signal $QTV_{oy}$ and provide it to the summation element 356. The summation element 356 may subtract the signal $QTV_{oy}$ from the signal 353 to produce the signal $V_y'$. In some implementations, the signal $V_{oy}"$ may be a natural offset of any analog circuitry that is interposed between the adjustment circuit 310 and the sensing element 304.

FIGS. 1A-2 are provided as an example only. Although in the example of FIGS. 1A-2, the sensor 100 is an angle sensor, it will be understood that the present disclosure is not limited to any specific type of sensor. In this regard, it will be understood that the adjustment circuit 120 (or portions thereof), which is discussed above with respect to FIGS. 1A-2, can be used to adjust the gain and/or offset of signals generated by transducer(s) in other types of sensors, such as 3D linear Hall effect sensors for example. Stated succinctly, the techniques and concepts described throughout the disclosure are not limited to any specific type of sensor.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used throughout the disclosure, the term product may include a physical object that is being bought and sold, a service, and/or anything else that can be purchased and solved.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

To the extent directional terms are used in the specification and claims (e.g., upper, lower, parallel, perpendicular, etc.), these terms are merely intended to assist in describing and claiming the invention and are not intended to limit the claims in any way. Such terms do not require exactness (e.g., exact perpendicularity or exact parallelism, etc.), but instead it is intended that normal tolerances and ranges apply. Similarly, unless explicitly stated otherwise, each numerical value and range should be interpreted as being approximate as if the word "about", "substantially" or "approximately" preceded the value of the value or range.

Moreover, the terms "system," "component," "module," "interface,", "model" or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

While the exemplary embodiments have been described with respect to processes of circuits, including possible implementation as a single integrated circuit, a multi-chip module, a single card, or a multi-card circuit pack, the described embodiments are not so limited. As would be apparent to one skilled in the art, various functions of circuit elements may also be implemented as processing blocks in a software program. Such software may be employed in, for example, a digital signal processor, micro-controller, or general-purpose computer.

Some embodiments might be implemented in the form of methods and apparatuses for practicing those methods. Described embodiments might also be implemented in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the claimed invention. Described embodiments might also be implemented in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the claimed invention. When implemented on a general-purpose processor, the program code segments combine with the processor to provide a unique device that operates analogously to specific logic circuits. Described embodiments might also be implemented in the form of a bitstream or other sequence of signal values electrically or optically transmitted through a medium, stored magnetic-field variations in a magnetic recording medium, etc., generated using a method and/or an apparatus of the claimed invention.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Also, for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

As used herein in reference to an element and a standard, the term "compatible" means that the element communicates with other elements in a manner wholly or partially specified by the standard, and would be recognized by other elements as sufficiently capable of communicating with the other elements in the manner specified by the standard. The compatible element does not need to operate internally in a manner specified by the standard.

It will be further understood that various changes in the details, materials, and arrangements of the parts which have been described and illustrated in order to explain the nature of the claimed invention might be made by those skilled in the art without departing from the scope of the following claims.

The invention claimed is:

1. A sensor, comprising:
a feedback circuit that is configured to generate a first feedback signal;
a first magnetic field sensing element that is arranged to generate a first sensor signal, the first sensor signal being a cosine projection of a rotational angle of a target;
a second magnetic field sensing element that is arranged to generate a second sensor signal, the second sensor signal being a sinusoidal projection of the rotational angle of the target;
a first analog frontend circuit that is arranged to receive the first sensor signal from the first magnetic field sensing element, receive the first feedback signal from the feedback circuit, and provide, to the feedback circuit, a first corrected sensor signal, the first corrected sensor signal being generated by adjusting a gain of the first sensor signal based on the first feedback signal; and
a second analog frontend circuit that is arranged to receive the second sensor signal from the second magnetic field sensing element, receive the first feedback signal from the feedback circuit, and provide, to the feedback circuit, a second corrected sensor signal, the second corrected sensor signal being generated by adjusting a gain of the second sensor signal based on the first feedback signal,
wherein the first feedback signal is generated at least in part based on a ratio of a first amplitude of the first corrected sensor signal and a second amplitude of the second corrected sensor signal.

2. The sensor of claim 1, further comprising a processing circuitry that is arranged to generate an output signal based on the first corrected sensor signal and the second corrected sensor signal, the output signal being indicative of the rotational angle of the target.

3. The sensor of claim 1, wherein the feedback circuit is further configured to:
detect a positive peak and a negative peak of the first corrected sensor signal;
detect a positive peak and a negative peak of the second corrected sensor signal;
detect the first amplitude of the first corrected sensor signal based on the positive peak and the negative peak of the first corrected sensor signal; and
detect the second amplitude of the second corrected sensor signal based on the positive peak and the negative peak of the second corrected sensor signal.

4. The sensor of claim 1, wherein:
the feedback circuit is further configured to generate a second feedback signal based on an offset of the first corrected sensor signal, and provide the second feedback signal to the first analog frontend circuit;
the feedback circuit is further configured to generate a third feedback signal based on an offset of the second corrected sensor signal, and provide the third feedback signal to the second analog frontend circuit;
the first corrected sensor signal is further generated based on the second feedback signal; and
the second corrected sensor signal is further generated based on the third feedback signal.

5. The sensor of claim 4, wherein:
the offset of the first corrected sensor signal is based on a difference between respective absolute values of a positive peak and a negative peak of the first corrected sensor signal, and
the offset of the second corrected sensor signal is based on a difference between respective absolute values of a positive peak and a negative peak of the second corrected sensor signal.

6. A sensor, comprising:
a feedback circuit that is configured to generate a first feedback signal and a second feedback signal;
a first magnetic field sensing element that is arranged to generate a first sensor signal, the first sensor signal being a cosine projection of a rotational angle of a target;
a second magnetic field sensing element that is arranged to generate a second sensor signal, the second sensor signal being a sinusoidal projection of the rotational angle of the target;
a first analog frontend circuit that is arranged to receive the first sensor signal from the first magnetic field sensing element, receive the first feedback signal from the feedback circuit, and provide, to the feedback circuit, a first corrected sensor signal, the first corrected sensor signal being generated by adjusting the first sensor signal based on the first feedback signal; and
a second analog frontend circuit that is arranged to receive the second sensor signal from the second magnetic field sensing element, receive the second feedback signal from the feedback circuit, and provide, to the feedback circuit, a second corrected sensor signal, the second corrected sensor signal being generated by adjusting the second sensor signal based on the second feedback signal,
wherein the first feedback signal is generated by averaging n most recent offset values in a stream of offset values of the first corrected sensor signal, where n is a positive integer greater than 1, and
wherein the second feedback signal is generated by averaging m most recent offset values in a stream of offset values second corrected sensor signal, where m is a positive integer greater than 1.

7. The sensor of claim 6, further comprising a processing circuitry that is arranged to generate an output signal based on the first corrected sensor signal and the second corrected sensor signal, the output signal being indicative of the rotational angle of the target.

8. The sensor of claim 6, wherein:
each of the offset values in the stream of offset values of the first corrected sensor signal is based on a difference between respective absolute values of a positive peak and a negative peak of the of-the-first corrected sensor signal, and
each of the offset values in the stream of offset values of the second corrected sensor signal is based on a difference between respective absolute values of a positive peak and a negative peak of the second corrected sensor signal.

9. The sensor of claim 6, wherein:
the feedback circuit is further configured to generate a third feedback signal and provide the third feedback signal to the first analog frontend circuit and the second analog frontend circuit;
the first corrected sensor signal is generated further based on the third feedback signal;
the second corrected sensor signal is generated further based on the third feedback signal; and
the third feedback signal is generated at least in part based on a first amplitude of the first corrected sensor signal and a second amplitude of the second corrected sensor signal.

* * * * *